(12) United States Patent
Lee

(10) Patent No.: US 8,050,127 B2
(45) Date of Patent: Nov. 1, 2011

(54) SEMICONDUCTOR MEMORY DEVICE

(75) Inventor: Joong-Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 142 days.

(21) Appl. No.: 12/494,844

(22) Filed: Jun. 30, 2009

(65) Prior Publication Data
US 2010/0202222 A1 Aug. 12, 2010

(30) Foreign Application Priority Data

Feb. 6, 2009 (KR) .................. 10-2009-0009618
Jun. 17, 2009 (KR) .................. 10-2009-0053792

(51) Int. Cl.
*G11C 7/02* (2006.01)
(52) U.S. Cl. ............. 365/214; 365/189.03; 365/189.08; 365/63; 365/51; 365/202; 365/207; 365/189.17
(58) Field of Classification Search .................. None
See application file for complete search history.

(56) References Cited

U.S. PATENT DOCUMENTS

| | | | | |
|---|---|---|---|---|
| 4,700,328 A | * | 10/1987 | Burghard | 365/51 |
| 4,982,368 A | * | 1/1991 | Arimoto | 365/206 |
| 4,982,370 A | * | 1/1991 | Matsumoto et al. | 365/222 |
| 5,243,574 A | * | 9/1993 | Ikeda | 365/207 |
| 5,276,641 A | * | 1/1994 | Sprogis et al. | 365/189.02 |
| 5,396,450 A | * | 3/1995 | Takashima et al. | 365/51 |
| 5,555,203 A | * | 9/1996 | Shiratake et al. | 365/51 |
| 5,610,871 A | * | 3/1997 | Hidaka | 365/230.03 |
| 5,732,010 A | * | 3/1998 | Takashima et al. | 365/63 |
| 5,917,744 A | * | 6/1999 | Kirihata et al. | 365/63 |
| 5,953,275 A | * | 9/1999 | Sugibayashi et al. | 365/207 |
| 5,966,315 A | * | 10/1999 | Muller et al. | 365/51 |
| 6,002,625 A | * | 12/1999 | Ahn | 365/206 |
| 6,104,653 A | * | 8/2000 | Proebsting | 365/203 |
| 6,154,406 A | * | 11/2000 | Miyano et al. | 365/220 |
| 6,272,062 B1 | * | 8/2001 | Mueller et al. | 365/230.02 |
| 6,297,985 B1 | * | 10/2001 | Kang | 365/145 |
| 6,304,479 B1 | * | 10/2001 | Vollrath et al. | 365/63 |
| 6,310,880 B1 | * | 10/2001 | Waller | 370/400 |
| 6,456,521 B1 | * | 9/2002 | Hsu et al. | 365/149 |
| 6,504,204 B1 | * | 1/2003 | Hsu et al. | 257/306 |
| 6,975,552 B2 | * | 12/2005 | Kim | 365/230.03 |
| 7,113,438 B2 | * | 9/2006 | Kang | 365/208 |
| 7,317,646 B2 | * | 1/2008 | Yoon et al. | 365/205 |
| 7,649,760 B2 | * | 1/2010 | Hong et al. | 365/51 |

FOREIGN PATENT DOCUMENTS

| | | |
|---|---|---|
| KR | 1020070040242 | 4/2007 |
| KR | 1020080014370 | 2/2008 |

OTHER PUBLICATIONS

Notice of Allowance issued from Korean Intellectual Property Office on May 31, 2011.

* cited by examiner

*Primary Examiner* — Viet Nguyen
(74) *Attorney, Agent, or Firm* — IP & T Group LLP

(57) ABSTRACT

A semiconductor memory device includes first and second sub-memory-cell areas configured to form a memory cell matrix and include a first bit line and a second bit line respectively to form a data transfer path corresponding to a predetermined memory cell, an additional bit line configured to cross the first sub-memory-cell area and form a data transfer path by being connected with the second bit line and a sensing and amplifying unit configured to sense and amplify data inputted through the additional bit line and the first bit line.

10 Claims, 2 Drawing Sheets

SEMICONDUCTOR MEMORY DEVICE

CROSS-REFERENCES TO RELATED APPLICATIONS

The present application claims priority of Korean Patent Application No. 10-2009-0009618 and 10-2009-0053792, filed on Feb. 6, 2009 and Jun. 17, 2009, respectively, the disclosure of each of which is incorporated herein by reference in their entirety.

BACKGROUND OF THE INVENTION

The present invention relates to a semiconductor design technology, and more particularly, to a semiconductor memory device including a plurality of memory cells.

The degree of the integration of a typical semiconductor memory device such as Double Data Rate Synchronous DRAM (DDR SDRAM) has been increasing significantly. Accordingly, one semiconductor memory device may include more than ten million memory cells. Such memory cells are regularly arranged and form a memory cell array. A group of memory cell arrays is referred to as a memory cell matrix (mat). A semiconductor memory device includes a plurality of memory cell matrixes.

Meanwhile, a memory cell structure of a semiconductor memory device is generally divided into a folded bit line structure and an open bit line structure.

The folded bit line structure typically includes a bit line sensing and amplifying unit, a bit line, and a bit line bar. The bit line sensing and amplifying unit is disposed at a core region of the semiconductor memory device. The bit line is used for driving data on the same memory cell matrix and the bit line bar is used as a reference for an amplification operation. The bit line and the bit line bar are arranged at the same memory cell matrix with respect the bit line sensing and amplifying unit. Therefore, the bit line and the bit line bar are affected by the same noise, and the generated noises are canceled by each other. The folded bit line structure guarantees stable operation over noise through the cancellation effect. Unlike the folded bit line structure, the open bit line structure includes a bit line and a bit line bar arranged at different memory cell matrixes with respect to the bit line sensing and amplifying unit. Therefore, noise generated from the bit line is different from noise generated from the bit line bar. As a result, the open bit line structure has a very low degree of noise tolerance.

The folded bit line structure includes a unit memory cell designed as $8F^2$, and the open bit line structure includes a unit memory cell designed as $6F^2$. Such a unit memory cell structure is a factor that decides a chip size of a semiconductor memory device. Based on the same data storage capacity, a semiconductor memory device having an open bit line structure may be designed to be smaller than a semiconductor memory device having a folded bit line structure.

FIG. 1 is a diagram illustrating a semiconductor memory device having an open bit line structure according to the related art.

Referring to FIG. 1, a semiconductor memory device according to the related art includes first and second memory cell matrixes having a plurality of memory cells arranged, a dummy matrix 105, and a plurality of sensing and amplifying units SA.

In general, the semiconductor memory device selects a memory cell corresponding to a row address and a column address in a read operation and outputs data stored in the selected memory cell. Here, the row address is used to activate one of a plurality of word lines WL and the column address is used to activate one bit of data amplified by the plurality of sensing and amplifying units SA.

Hereinafter, a read operation for reading data corresponding to a first bit line bar/BL1 will be described.

When a word line WL is activated in response to a row address for reading data corresponding to the first bit line bar/BL1, data stored in a memory cell connected to the activated word line WL is transferred to the plurality of sensing and amplifying units SA through a corresponding bit line. The plurality of sensing and amplifying units SA senses the transferred data and a reference voltage level which is a reference for sense amplification. Here, a sensing and amplifying unit 170A senses voltages of the first bit line bar/BL1 and the first bit line BL1 and performs an amplification operation. Here, the first bit line bar/BL1 is used to transfer data and the first bit line BL1 is used to transfer a reference voltage level. That is, the sensing and amplifying unit 170A senses and amplifies data transferred through the first bit line bar/BL1 using the first bit line and bit line bar BL1 and/BL1. Then, the sensing and amplifying unit 170A is selected by a column address, and the sense-amplified data is outputted.

Hereinafter, a read operation for reading data corresponding to a second bit line BL2 will be described.

When a word line WL is activated in response to a row address for reading data corresponding to the second bit line BL2, data stored in a memory cell connected to the selected word line WL is transferred to a sensing and amplifying unit SA through a corresponding bit line. A sensing and amplifying unit 170B senses voltages of a second bit line BL2 and a second bit line bar/BL2. That is, the second bit line BL2 is used to transfer data, and the second bit line bar/BL2 is used to transfer a voltage level which is a reference for a sensing and amplifying operation.

As described above, the semiconductor memory device according to the related art requires the dummy matrix 150 as a reference bit line to compare data of the second bit line BL2. The dummy matrix 150 includes the same load compared to that of the first memory cell matrix 110 and occupies the same amount of area as that occupied by the first cell matrix 110.

Thus, developing a semiconductor memory device having a comparatively small chip size by maximizing area efficiency by modifying an open bit line structure is desired.

SUMMARY OF THE INVENTION

An embodiment of the present invention is directed to providing a semiconductor memory device having a small chip size by modifying an open bit line structure.

Another embodiment of the present invention is directed to providing a semiconductor memory device having a small chip size by modifying a dummy matrix that occupies a predetermined area of a semiconductor memory device.

In accordance with an aspect of the present invention, there is provided a semiconductor memory device comprising first and second sub-memory-cell areas configured to form a memory cell matrix and include a first bit line and a second bit line respectively to form a data transfer path corresponding to a predetermined memory cell, an additional bit line configured to cross the first sub-memory-cell area and form a data transfer path by being connected with the second bit line and a sensing and amplifying unit configured to sense and amplify data inputted through the additional bit line and the first bit line.

In accordance with another aspect of the present invention, there is provided a semiconductor memory device comprising a plurality of memory cell matrixes each including a first bit line, a second bit line, and an additional bit line, where the first bit line and the second bit line form a data transfer path corresponding to a predetermined memory cell and the additional bit line forms a data transfer path by being connected with the second bit line and crosses a sub-memory-cell area, a sensing and amplifying unit configured to sense and amplify data inputted through the additional bit line and the first bit line and a load unit connected to at least one of the plurality of memory cell matrixes and configured to have a load value corresponding to the additional bit line.

As described above, a semiconductor memory device according to the present invention has a small chip size by modifying an open line bit structure according to the related art. Also, a semiconductor memory device according to the present invention has a small chip size by modifying a dummy matrix that occupies a predetermined area.

DESCRIPTION OF SPECIFIC EMBODIMENTS

Other objects and advantages of the present invention can be understood by the following description, and become apparent with reference to the embodiments of the present invention.

Figure 2:
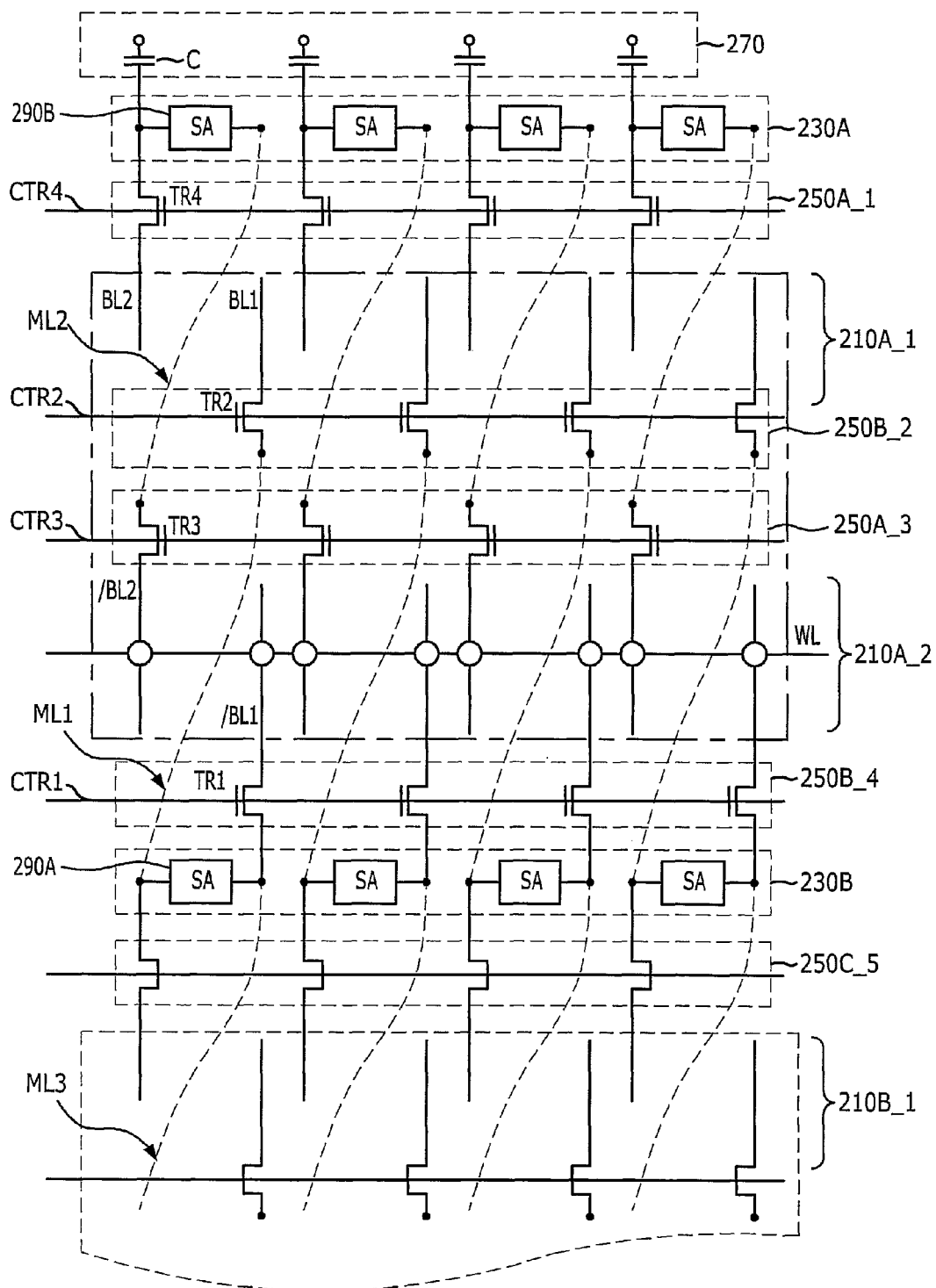
FIG. 2 is a diagram illustrating a semiconductor memory device in accordance with an embodiment of the present invention.

FIG. 2 is a diagram illustrating a semiconductor memory device in accordance with an embodiment of the present invention.

Referring to FIG. 2, a first memory cell matrix is divided into a first sub-memory-cell area 201A_1 and a second sub-memory-cell area 210A_2. Each of the first and second sub-memory-cell areas 201A_1 and 210A_2 includes a plurality of memory cells. Although FIG. 2 shows only a part 210B_1 of a second memory cell matrix, the second memory cell matrix has the same structure as that of the first memory cell matrix. For illustration purposes, the first memory cell matrix is a memory cell matrix arranged at an edge of a plurality of memory cell matrixes. Then, a plurality of sensing and amplifying units SA 230A and 230B are arranged at a top side and a bottom side of the first memory cell matrix. The plurality of sensing and amplifying units SA 230A and 230B sense and amplify data of a corresponding memory cell. The plurality of first sensing and amplifying units 230A sense and amplify data of a second additional bit line ML2 crossing the first memory cell area 210A_1 and, for example, a second bit line BL2 disposed at the first memory cell 210A_1. The plurality of second sensing and amplifying units 230B sense and amplify data of a first additional bit line ML1 crossing the second memory cell area 210A_2 and, for example, a first bit line bar/BL1 disposed at the second memory cell area 210A_2.

Particularly, the plurality of second sensing and amplifying unit 230B not only performs a sensing and amplifying operation corresponding to the first memory cell matrix 210A_1 and 210A_2 but also performs a sensing and amplifying operation corresponding to the second memory cell matrix 210B_1. That is, the plurality of second sensing and amplifying units 230B are disposed between the first memory cell matrix and the second memory cell matrix and shared by the first memory cell matrix and the second memory cell matrix.

The plurality of second sensing and amplifying units 230B perform a sensing and amplifying operation corresponding to the first memory cell matrix and performs a sensing and amplifying operation corresponding to the second memory cell matrix. Here, it is preferable that the sensing and amplifying operation corresponding to the first memory cell matrix 210A_1 and 210A_2 and the sensing and amplifying operation corresponding to the second memory cell matrix 210B_1 have different sensing and amplifying cycles, which may be controlled by first to fourth driving controlling signals CTR1, CTR2, CTR3, and CTR4.

A plurality of first switches 250A_1 are disposed between the plurality of first sensing and amplifying units 230A and the first memory cell area 210A_1 to form data transfer paths of a plurality of bit lines corresponding to the second bit line BL2 among the plurality of bit lines disposed in the first memory cell area 210A_1 and form data transfer paths of the plurality of first sensing and amplifying units 230A. A plurality of second switches 250B_2 are disposed between the first memory cell area 210A_1 and the second memory cell area 210A_2 to form data transfer paths of a plurality of bit line corresponding to a first bit line BL1 among a plurality of bit lines in the first memory cell area 210A_1 and to form data transfer paths of a plurality of second additional bit lines. A plurality of third switches 250A_3 are also disposed between the first memory cell area 210A_2 and the second memory cell area 210A_2 to form data transfer paths of a plurality of bit lines corresponding to a second bit line bar/BL2 among a plurality of bit lines in the second memory cell area 210A_2 and to form data transfer paths of first bit lines. A plurality of fourth switches 250B_4 are disposed between the second memory cell area 210A_2 and a plurality of second sensing and amplifying units 230B to form a data transfer path on a plurality of bit lines corresponding to the first bit line bar/BL1 among a plurality of bit lines in the second memory cell area 210A_2 and to form data transfer paths of a plurality of second sensing and amplifying units 230B.

The plurality of load units 270 will be described after describing a read operation according to the present embodiment.

For illustration purposes, a read operation corresponding to the first bit line bar/BL1 will be described first. Here, second and fourth driving control signals CTR2 and CTR4 for controlling a plurality of second switches 250B_2 and a plurality of fourth switches 250B_4 are activated. Then, transistors of the plurality of second switches 250B_2 and fourth switches 250B_4 are turned on. That is, the second and fourth driving control signals CTR2 and CTR4 are activated at the same time. Accordingly, the second switches 250B_2 and the fourth switches 250B_4 are also turned on at the same time.

Meanwhile, a plurality of switches 250C_5 connected to the plurality of second sensing and amplifying units 230B corresponding to the second memory cell matrix 210B_1 are turned off by a corresponding driving control signal. The turn-off operation of the fifth switch 250C_5 is performed to avoid data conflict. That is, the turn-off operation of the fifth switch 250C_5 makes the sensing and amplifying operation of the first memory cell matrix 210A_1 and 210A_2 to have a different sensing and amplifying cycle compared to that of the second memory cell matrix 210B_1.

When a word line WL is activated in response to a row address for reading data corresponding to the first bit line bar/BL1, data stored in a memory cell connected to the activated word line WL is transferred to a plurality of sensing and amplifying units SA through a corresponding bit line. The plurality of sensing and amplifying units SA sense the transferred data and a reference voltage level and amplifies sensed data and reference voltage level. Here, a sensing and amplifying unit 290A senses voltages of the first bit line bar/BL1 and the first additional bit line ML1 and performs a related amplification operation. Here, the first bit line bar/BL1 is used to transfer data, and the first additional bit line ML1 is used to transfer a reference voltage level transferred from the first bit line BL1. That is, the sensing and amplifying units 290A uses the first additional bit line ML1 connected to the first bit line BL1 and the first bit line bar/BL1 to sense and amplify data transferred through the first bit line bar/BL1. Then, the sensing and amplifying unit 290A is selected by a column address and outputs the sensed and amplified data.

As described above, the first additional bit line ML1 is used to sense and amplify data transferred through the first bit line bar/BL1. That is, the load of the first additional bit line ML1 is reflected when the sensing and amplifying operation is performed. Such load may cause error during the sensing and amplifying operation. However, such error is not generated in the present embodiment because a third additional bit line ML3 is connected to the sensing and amplifying unit 290A to compensate the load of the first additional bit line ML1. In other words, the first bit line bar/BL1 and the first bit line BL1 reflect the same load value to the sensing and amplifying unit 290A without considering data. It guarantees an environment for performing stable sensing and amplifying operation. For illustration purposes, the third additional bit line ML3 is used for read/write operations of a memory cell included in the second memory cell matrix 210B_1.

Hereinafter, a read operation for reading data corresponding to the second bit line bar/BL2 will be described. Here, first and third driving control signals CTR1 and CTR3 are activated for controlling a plurality of first switches 250A_1 and third switches 250A_3, and transistors of the first and third switches 250A_1 and 250A_3 are turned.

When a word line WL is activated in response to a row address for reading data corresponding to the second bit line bar/BL2, data stored in a memory cell connected to the activated word line WL is transferred to a plurality of sensing and amplifying units SA. The plurality of sensing and amplifying units SA sense and amplify the transferred data and a reference voltage level. Here, a sensing and amplifying unit 290B senses voltages of the second bit line BL2 and the second additional bit line ML2 and performs a related amplification operation. Here, the second bit line BL2 is used to transfer a reference voltage level and the second additional bit line ML2 is used to transfer data to the second bit line bar/BL2. That is, the sensing and amplifying unit 290B uses the second additional bit line ML2 connected to the second bit line bar/BL2 and the second bit line BL2 to sense and amplify data transferred through the second bit line bar/BL2. Then, the sensing and amplifying unit 290A is selected by a column address and outputs the sensed and amplified data.

Figure 1:
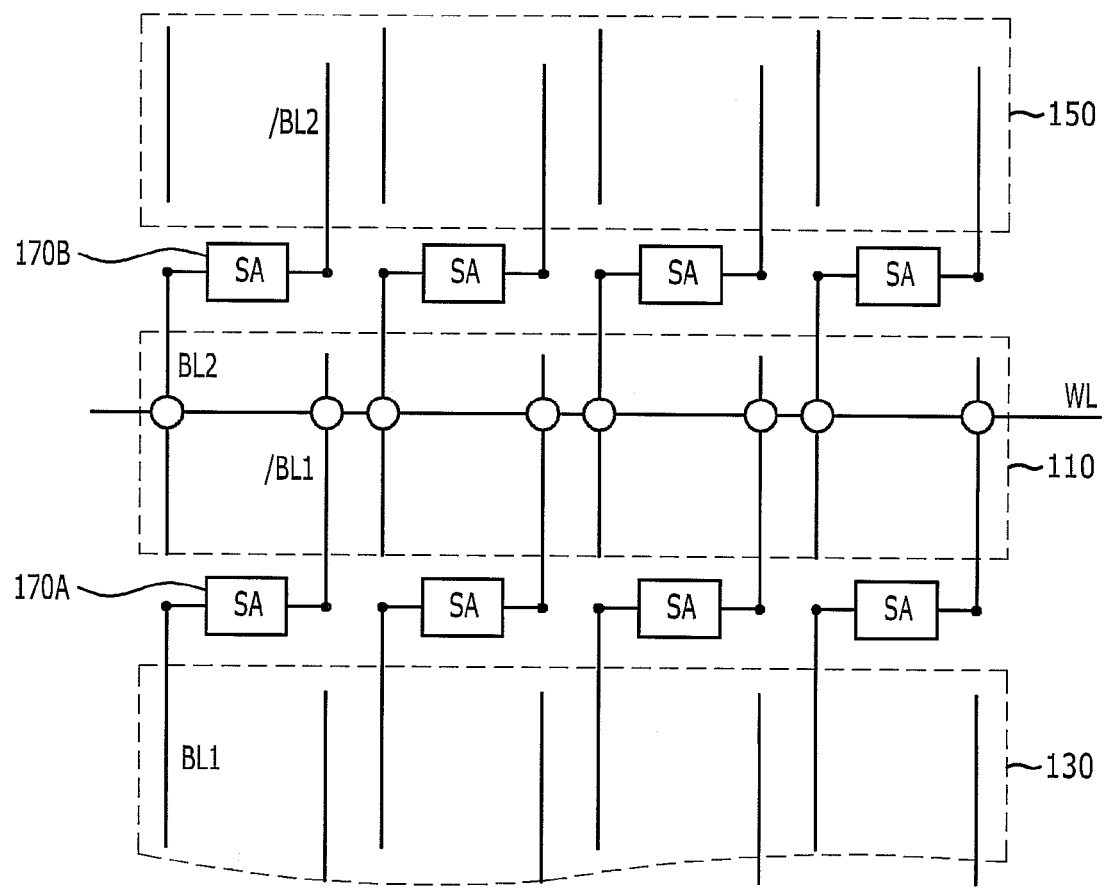
FIG. 1 is a diagram illustrating a semiconductor memory device having an open line structure according to the related art.

As described above, the reference voltage level is transferred through the second bit line BL2 when a read operation is performed to read data corresponding to the second bit line bar/BL2. If it is assumed that no load is on the second additional bit line ML2, it is possible to form a reference voltage level without requiring additional dummy matrix 150 (see FIG. 1) and to transfer the reference voltage level to the sensing and amplifying unit 290A in the present embodiment. However, if load is on the second additional bit line ML2, the load corresponding to the second additional bit line ML2 should be reflected during the sensing and amplifying operation of the sensing and amplifying unit 290A. Therefore, a plurality of load units 270 are included in the present embodiment for compensation.

Each of the plurality of load units 270 has a load value of each additional bit line corresponding to the second additional bit line ML2 crossing the first memory cell area 210A_1. Then, the plurality of load units 270 include a plurality of capacitors connected to each of bit lines corresponding to the second bit line BL2 included in the first memory cell met 210A_1 and 210A_2 disposed at an edge, particularly, in the first memory cell area 210A_1. The plurality of capacitors C may occupy comparatively small area. That is, it is possible to reduce a chip size of a semiconductor memory device. As described above, the semiconductor memory device according to the present embodiment can compensate load of the second additional bit line ML2 by including the plurality of load units 270.

As described above, in the semiconductor memory device according to the present embodiment shares one sensing and amplifying unit with a plurality of memory cell matrixes. Therefore, one sensing and amplifying unit controls an extended memory cell area in the present embodiment. It means that it is possible to reduce an area occupied by the sensing and amplifying units up to about 50%. Also, the semiconductor memory device according to the present embodiment includes a plurality of load units 270. Compared to an area occupied by a dummy matrix 150 (see FIG. 1), the plurality of load units 270 occupy a comparatively small area. Therefore, the semiconductor memory device according to the present embodiment has a comparatively small chip size and such an advantage of the present embodiment may improve the productivity of a semiconductor memory device.

While the present invention has been described with respect to the specific embodiments, it will be apparent to those skilled in the art that various changes and modifications may be made without departing from the spirit and scope of the invention as defined in the following claims.

The above described logic gates and transistors may be modified in location and type according to a polarity of an input signal.

What is claimed is:
1. A semiconductor memory device comprising:
a plurality of memory cell matrixes each including a first bit line, a second bit line, and an additional bit line, where the first bit line and the second bit line form a data transfer path corresponding to a predetermined memory cell and the additional bit line forms a data transfer path by being connected with the second bit line and crosses a sub-memory-cell area;
a sensing and amplifying unit configured to sense and amplify data inputted through the additional bit line and the first bit line; and
a load unit connected to at least one of the plurality of memory cell matrixes and configured to have a load value corresponding to the additional bit line.

2. The semiconductor memory device of claim 1, wherein each of the plurality of memory cell matrixes includes:
a first sub-memory-cell area including the first bit line; and
a second sub-memory-cell area including the second bit line,
wherein the first sub-memory-cell area and the second sub-memory-cell area are arranged in a stacking structure.

3. The semiconductor memory device of claim 1, wherein the load unit is connected to a memory cell matrix disposed at an edge of the plurality of memory cell matrixes.

4. The semiconductor memory device of claim 1, further comprising:

a first switching unit configured to form a data transfer path of the first bit line and the sensing and amplifying unit; and a second switching unit connected to the additional bit line and configured to form a data transfer path of the second bit line and the sensing and amplifying unit through the additional bit line.

5. The semiconductor memory device of claim 4, wherein the load unit is connected to the first switching unit.

6. The semiconductor memory device of claim 4, wherein the first switching unit is disposed between the sensing and amplifying unit and the first bit line.

7. The semiconductor memory device of claim 4, wherein the second switching unit is disposed between the first sub-memory-cell area and the second sub-memory-cell area.

8. The semiconductor memory device of claim 4, wherein the first switching unit and the second switching unit are activated at the same time in response to a control signal.

9. The semiconductor memory device of claim 1, wherein a sensing and amplifying unit disposed between first and second memory cell matrixes among the plurality of memory cell matrixes performs a sensing and amplifying operation corresponding to the first and second memory cell matrixes, and a sensing and amplifying operation corresponding to the first memory cell matrix has a sensing and amplifying operation period different from a sensing and amplifying operation period of a sensing and amplifying operation corresponding to the second memory cell matrix.

10. The semiconductor memory device of claim 1, wherein the load unit is a capacitor.

* * * * *